United States Patent [19]
Andoh et al.

[11] Patent Number: 5,180,975
[45] Date of Patent: Jan. 19, 1993

[54] POSITIONING DEVICE AND IC CONVEYOR UTILIZING THE SAME

[75] Inventors: Masakazu Andoh; Shigenori Kawano, both of Gyoda, Japan

[73] Assignee: Advantest Corporation, Tokyo, Japan

[21] Appl. No.: 612,434

[22] Filed: Nov. 14, 1990

[30] Foreign Application Priority Data

Nov. 16, 1989 [JP] Japan .................... 1-298648

[51] Int. Cl.⁵ .......................... G01R 1/02; B23Q 3/18; F16H 53/06; G05G 11/00
[52] U.S. Cl. .................................. 324/158 F; 74/569; 74/479; 108/140; 33/373; 414/749; 269/58
[58] Field of Search ........................ 269/27, 55, 58, 66, 269/903, 59; 414/749; 108/140, 137, 139; 33/1 M, 568, 573; 324/158 F; 74/567, 569, 479, 527

[56] References Cited
U.S. PATENT DOCUMENTS

| | | | |
|---|---|---|---|
| 1,915,346 | 6/1933 | Wurm | 108/139 |
| 2,298,875 | 10/1942 | Dowell | 33/568 |
| 2,610,099 | 9/1952 | McNamara, Jr. | 108/140 |
| 3,918,167 | 11/1975 | Gerber | 33/568 |
| 4,155,272 | 5/1979 | Mosher | 33/1 M |
| 4,306,464 | 12/1981 | Mosher | 74/479 |
| 4,527,119 | 7/1985 | Rogers et al. | 33/1 M |
| 4,596,076 | 6/1986 | Sigg | 33/573 |
| 4,641,866 | 2/1987 | Haeck | 74/567 |
| 4,784,377 | 11/1988 | Woodward | 269/58 |
| 4,797,053 | 1/1989 | Balter | 414/749 |
| 4,948,330 | 8/1990 | Nomura | 414/749 |
| 4,958,437 | 9/1990 | Helms | 33/1 M |
| 5,031,547 | 7/1991 | Hirose | 269/58 |

FOREIGN PATENT DOCUMENTS

| | | | |
|---|---|---|---|
| 0202630 | 11/1986 | European Pat. Off. | 33/573 |
| 0074601 | 5/1982 | Japan | 33/573 |

Primary Examiner—Ernest F. Karlsen
Assistant Examiner—William J. Burns
Attorney, Agent, or Firm—Staas & Halsey

[57] ABSTRACT

A first cam is fixedly provided on a base plate and a position-adjustable second cam is disposed apart from the first cam. A block movable by a driver is disposed between the first and second cams. While abutting against the first cam, the movable block is held at a fixed first position, and while abutting against the second cam, it is held at a second position defined by the second cam. The second position is preset, as desired, by adjusting the translational and rotational positions of the second cam and the movable block is switched by the driver between the first and second positions.

10 Claims, 5 Drawing Sheets

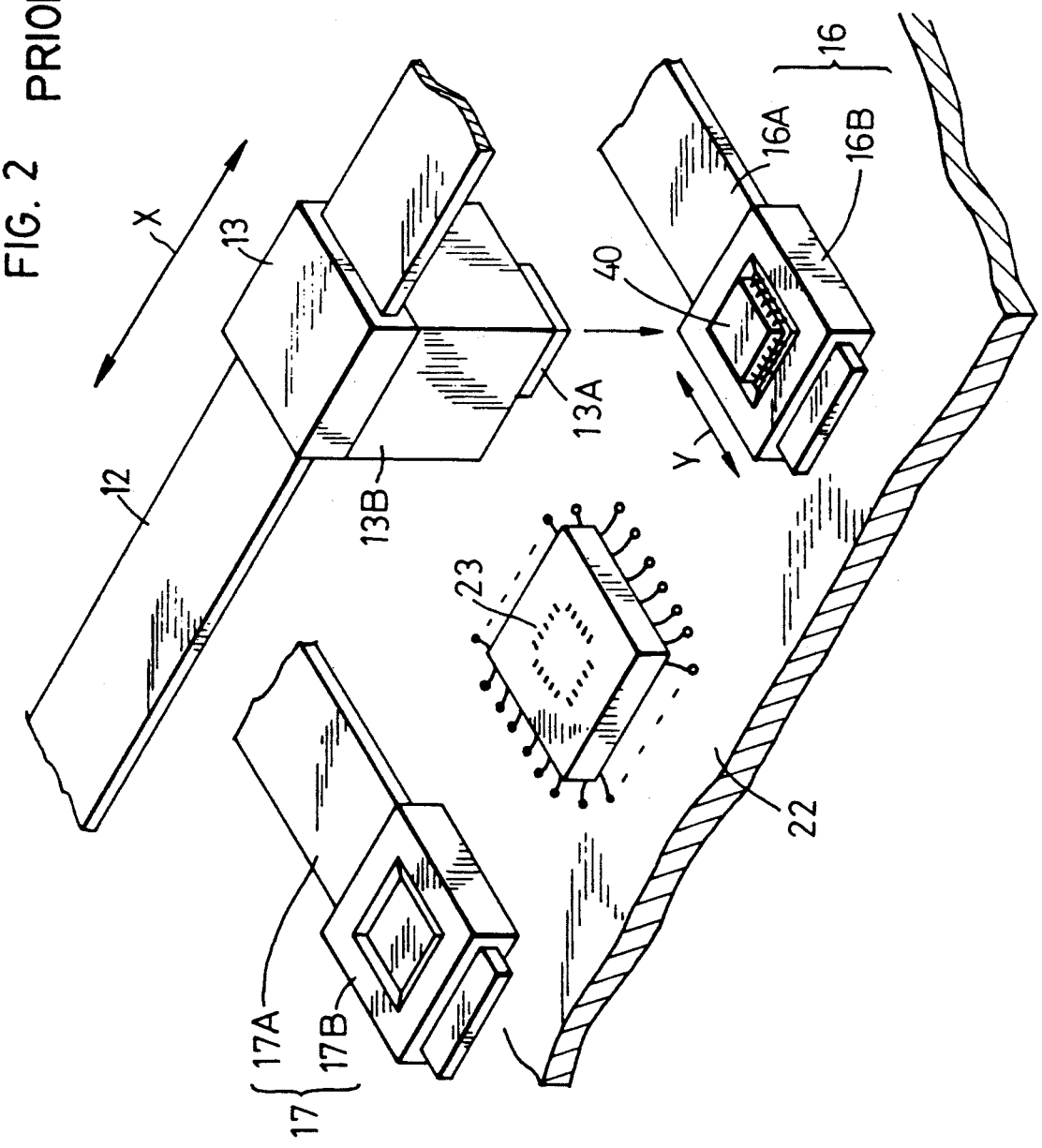

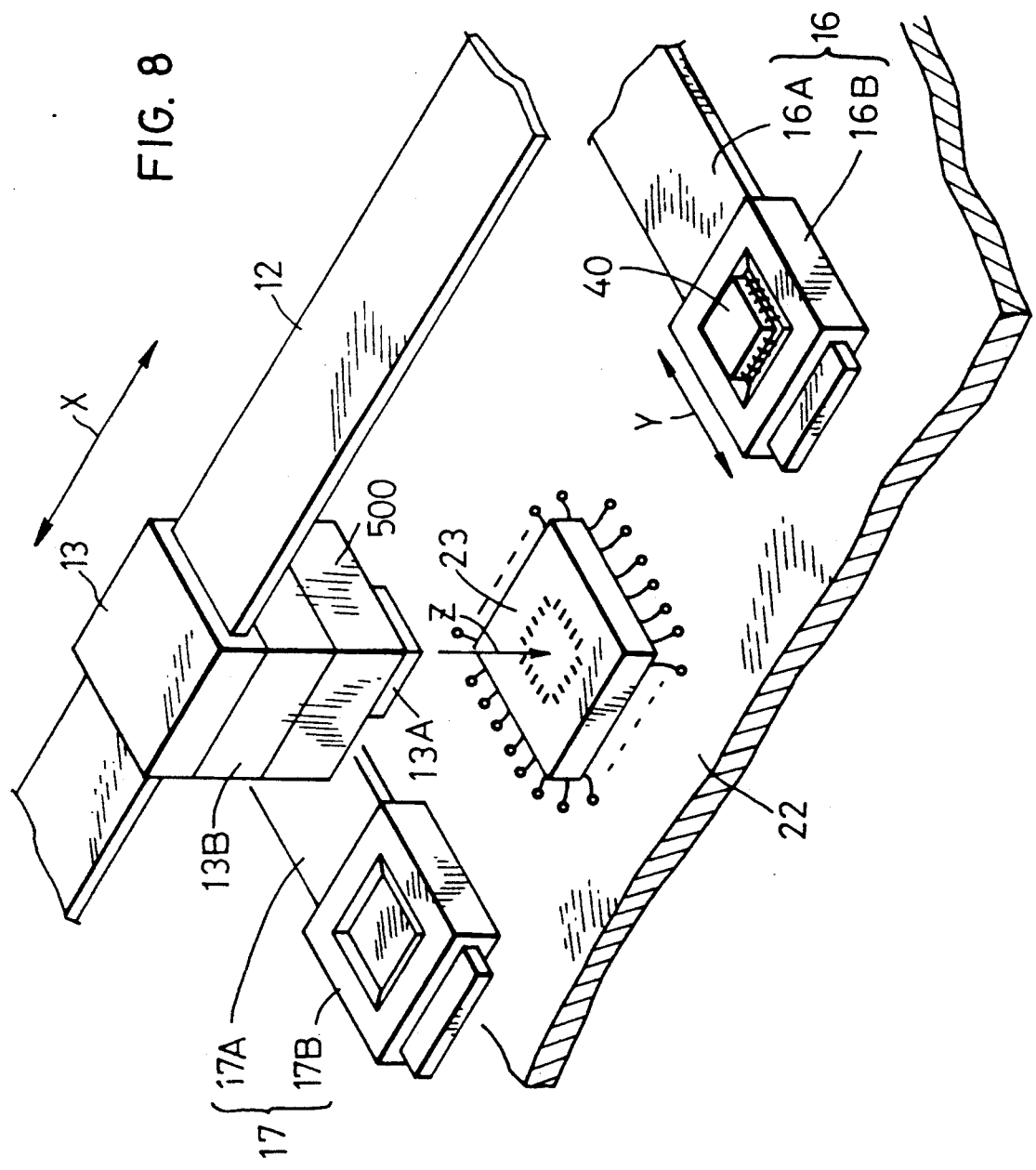

POSITIONING DEVICE AND IC CONVEYOR UTILIZING THE SAME

BACKGROUND OF THE INVENTION

The present invention relates to a positioning device suitable for use in IC test equipment for testing, for instance, surface-mounting-type IC's and an IC conveyor for bringing an IC to be tested from a predetermined position to a test socket disposed at a testing position and for bringing the tested IC from the test socket to another position.

IC's can be split into DIP-type and surface-mounting-type ones according to the type of mounting to the printed circuit board.

Because of the structure of its terminals the surface-mounting-type IC cannot be mounted astride a guide rail for conveyance to the position of the test socket in the IC tester. For this reason, the surface-mounting-type IC is picked up by an air chuck, which is moved to bring the IC to the position of the test socket.

The IC testing device includes an auto-handler for automatically conveying an IC to the position of the test socket, removing therefrom the tested IC and conveying it to a storage after assorting it into a non-defective or defective, and a test head for receiving on the test socket the IC conveyed thereto by the auto-handler and electrically connecting each terminal of the IC to the tester.

FIG. 1 shows an example of such an IC testing device. Reference numeral 10 indicates an auto-handler, 20 a test head and 30 a tester. The auto-handler 10 includes: a constant temperature bath for heating or cooling an IC to be tested to a desired temperature; a storage for storing the IC's to be tested; a storage for storing tested IC's assorted into non-defectives and defectives; a conveyor for conveying the IC to be tested from the storage to the constant temperature bath; a conveyor for conveying the IC from the constant temperature bath to a position just above the test head 20; a conveyor for loading the IC to be tested onto a test socket disposed at the upper portion of the test head 20 and for unloading the tested IC from the socket; and a conveyor for conveying the unloaded IC to a non-defective or defective storage.

The test head 20 has the test socket at its upper portion and the test socket is connected via a cable 21 to a tester 30. The auto-handler 10 is a mechanical unit, whereas the test head 20 is an electric circuit unit. The auto-handler 10 and the test head 20 are produced separately and combined by a common frame 11. The positioning accuracy necessary for the IC conveyor of the auto-handler 10 to load the IC onto the test socket of the test head 20 is on the order of microns.

As shown in FIG. 2, the test head 20 has a performance board 22 fixedly mounted thereon, the performance board 22 having at its center a test socket 23 detachably mounted thereon. Above the test socket 23 there is provided an IC conveyor 13 of the auto-handler 10 in a manner to be movable laterally. That is, a rail 12 is installed in the X-axis direction, on which the IC conveyor 12 is movably mounted.

Under the IC conveyor 13 there is provided an air chuck 13A, on which there is provided a lifting gear 13B. An IC to be tested 40, brought by a first conveyor 16 to the loading position, is picked up by the air chuck 13A, by which it is brought to the position above the test socket 23 and then loaded thereon. Upon completion of the test, the lifting gear 13B is actuated, by which the IC is unloaded from the test socket 23 and then taken over to a second conveyor 17 disposed at an unloading position.

The first and second conveyors 16 and 17 respectively comprise straight rails 16A, 17A and carriages 16B, 17B which are guided by the rails 16A, 17A. The first conveyor 16 conveys the IC to be tested 40 from the constant temperature bath to the position just above the test head 20. The second conveyor 17 brings the tested IC 40 back to the storage.

When the IC to be tested 40 is brought thereto by the first conveyor 16, the IC conveyor 13 lowers the air chuck 13A, causes it to pick up the IC 40, raises air chuck 13A, moves in the X-axis direction, stops at a predetermined position above the test socket 23 and then lowers the air chuck 13A to load the IC 40 onto the socket 23. At this time, terminals of the IC 40 must be connected to predetermined contacts of the test socket 23. It is therefore necessary that the IC 40 brought by the IC conveyor 13 to the predetermined position accurately bear a predetermined positional relationship to the test socket 23.

A positional error between the test socket 23 and the IC 40 brought to the predetermined position above the test socket 23 is a combination of translational and angular displacements as depicted in FIGS. 3 and 4. That is, the positional error can be divided into a displacement of the IC 40 in each of the X-axis and Y-axis directions in parallel thereto as shown in FIG. 3 and an angular displacement relative to each of the X-axis and Y-axis directions, i.e. a rotational displacement in the X-Y plane as shown in FIG. 4.

The positional error in the X-axis direction can be avoided by adjusting the stop position of the conveyor 13, whereas the positional error in the Y-axis direction can similarly be avoided by adjusting the stop position of the first conveyor. In addition, the stop positions of the conveyors 13 and 16, once set, can be reproduced with high accuracy any number of times.

It is necessary, however, to adjust the stop positions in the X-axis and Y-axis directions several times alternately with each other every time the test socket 23 is changed for each kind of an IC to be tested. Besides, the positional error resulting from the rotatory motion such as shown in FIG. 4 cannot be eliminated even by the adjustment of the stop positions of the conveyors 13 and 16. The position error of this kind can be avoided only by adjusting the mounting position of the test head 20 on which the test socket 23 is mounted through the performance board 22, but this is difficult, because the weight of the test head 20 is very large.

SUMMARY OF THE INVENTION

It is therefore an object of the present invention to provide a positioning device which permits correcting rotational and translational position errors of an IC to be tested.

Another object of the present invention is to provide an IC conveyor which is capable of accurately conveying an IC to be tested from a predetermined position to the position of a test socket.

The positioning device of the present invention includes a first cam fixedly mounted on a base plate, a second cam disposed thereon at a distance from the first cam and adjustable in position, and a movable block disposed between the first and second cams. The movable block abuts, at its first position, against the first cam to assume a first posture defined by the first cam and, at its second position, abuts against the second cam to assume a second posture defined by the second cam. The positioning device further includes a driver for driving the movable block to a selected one of the first and second positions.

With the above structure, the movable block accurately can be switched, with high reproducibility, between the first and second positions defined by the first and second cams, respectively. Consequently, a rotational position error of any angle and a translational position error in any direction can be corrected in the positioning of the IC to be tested.

The IC conveyor of the present invention includes a carriage movable above the test socket mounted on the test head, the above-mentioned positioning device of the present invention mounted on the carriage, and an air chuck mounted on the movable block of the positioning device.

With the IC conveyor of the present invention it is possible to easily position the IC to be tested with respect to the test socket without positioning the autohandler and the test head relative to each other.

BRIEF DESCRIPTION OF THE DRAWINGS

FIG. 2 is a perspective view for explaining how to convey an IC to be tested 40 in the test equipment shown in FIG. 1;

FIG. 5A is a sectional view taken along line Va—Va of FIG. 5 showing a screw 203 and its vicinity;

FIG. 8 is a perspective view illustrating the IC conveyor employing the positioning device of the present invention.

DESCRIPTION OF THE PREFERRED EMBODIMENTS

Figure 5:
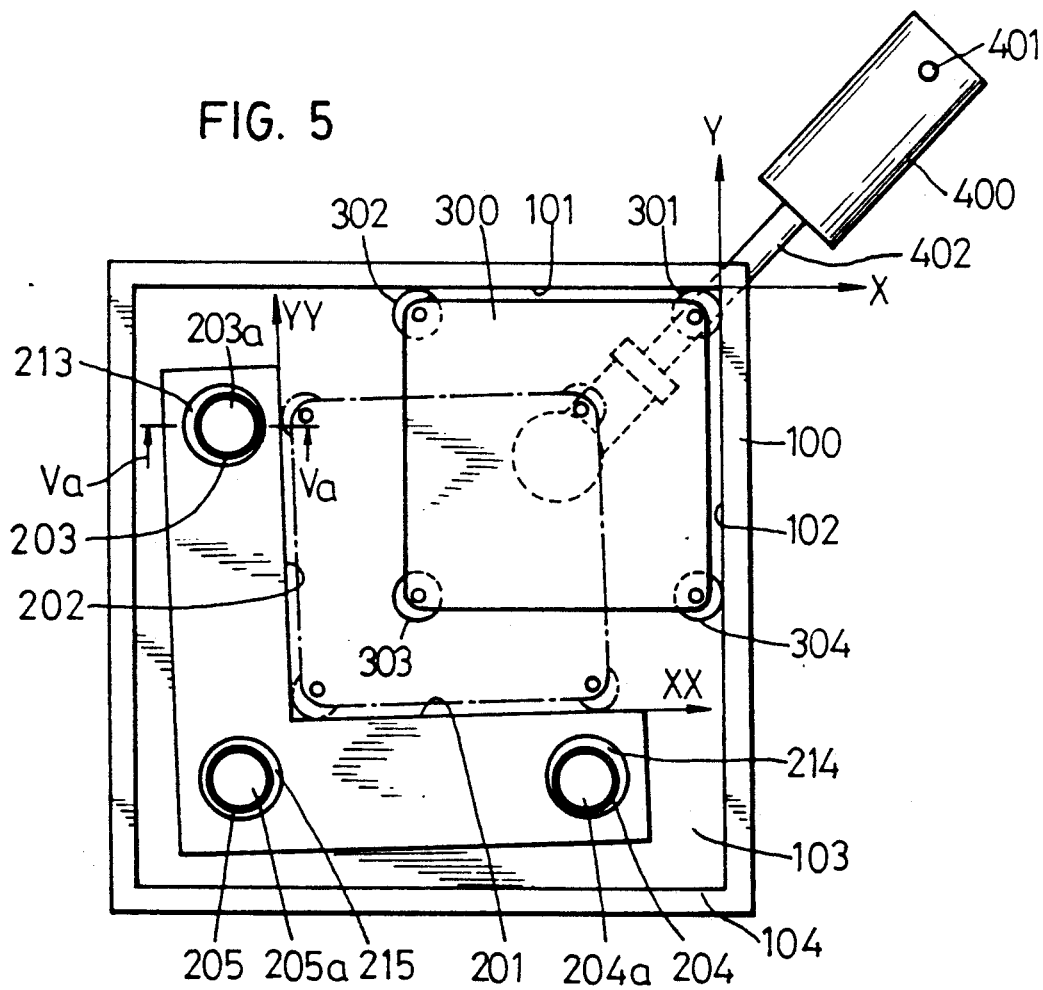
FIG. 5 is a plan view illustrating an embodiment of the positioning device of the present invention.
Figure 5:
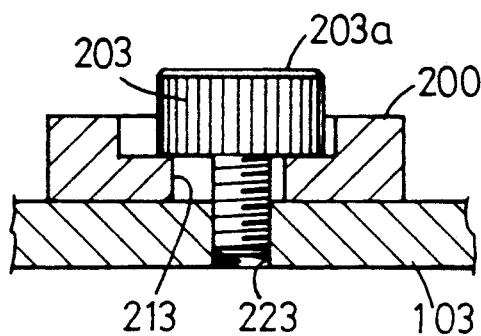

FIG. 5 illustrates an embodiment of the positioning device of the present invention. Reference numeral 100 indicates a first cam, or positioning means 200 a second cam or positioning means and 300 a movable block. The first cam 100 has two perpendicularly intersecting faces 101 and 102, which are assumed to define fixed first orthogonal coordinates X-Y. In this example the first cam 100 is formed by side walls 104 raised along the periphery of a square base plate 103 to form the two perpendicularly intersecting faces 101 and 102.

The second cam 200 is formed by an L-shaped metal member and has two perpendicularly intersecting faces 201 and 202. Further, the second cam 200 has clearance holes 213, 214 and 215 made therein near both its ends and at its corner which permit adjustment of the position of the second cam 200. The second cam 200 is clamped to the base plate 103 of the first cam 100 by screws 203, 204 and 205 inserted in the clearance holes 213, 214 and 215. As seen from FIG. 5A which shows in section the screw 203 and its vicinity, the inner diameters of the clearance holes 213, 214 and 215 are sufficiently larger than the outer diameters of the shafts of the screws 203, 204 and 205 and sufficiently smaller than the outer diameters of their heads 203a, 204a and 205a so that the position of the second cam 200 can be adjusted. Tapped holes 223, 224 and 225 for the screws 203, 204 and 205 are made in the base plate 103 (FIG. 5A showing only the tapped hole 223). The screws 203, 204 and 205 are screwd into the tapped holes 223, 224 and 225 to clamp the second cam 200 with their heads 203a, 204a and 205a. With the screws 203, 204 and 205 loosened, the rotational and translational positions of the two faces 201 and 202 can freely be set within the limit of play which is defined by differences in diameter between the screws 203, 204 and 205 and the tapped holes 213, 214 and 215 receiving them. Now, let it be assumed that the two faces 201 and 202 define second orthogonal coordinates XX-YY which can be shifted. Consequently, the second orthogonal coordinates XX-YY bear such a relationship to the afore-mentioned first orthogonal coordinates X-Y that the former has translated in parallel to and rotated through an angle $\theta$ relative to the latter.

The movable block 300 is disposed within the space defined by the faces of 101, 102, 201, 202 of the first and second cams 100 and 200 in such a manner as to be movable along the base plate 103. The movable block 300 is driven, by an air cylinder or similar rectilinear driver 400, between positions where to abut against the first cam 100 and the second cam 200, respectively.

The rectilinear driver 400 is supported at one end by a shaft 401 in a manner to be movable in a plane parallel to the major surface of the base plate 103. The driver 400 has its moving rod 402 held in parallel to the base plate 103 and linearly drives the rod 402 lengthwise thereof. The movable block 300 is attached to the tip of the rod 402 in such a manner as to be movable in the plane parallel to the base plate 103.

The movable block 300 is formed by, for instance, a square plate-like member and carries at its four corners rollers 301 through 304 whose rotary shafts are perpendicular to the block body, the rollers 301 to 304 making contact with the cam faces 101, 102 or 201, 202.

The rod 402 of the rectilinear driver 400 is at an angle of approximately 45° to the cam faces 101 and 102 of the first cam 100 and the cam faces 201 and 202 of the second cam 200. By moving the movable block 300 in the above direction the block 300 can be actuated between first and second states in which it abuts against the first cam 100 and the second cam 200, respectively. In the first state the roller 301 abuts against the both cam faces 101 and 102 simultaneously at the corner where they meet, and hence is fixed in position, and at least one of the neighboring rollers 302 and 304, in this example, both of them abut against the cam faces 101 and 102, respectively, by which the position of the movable block 300 is fixed with respect to the first orthogonal coordinates X-Y. Similarly, in the second state the roller 303 abuts against the cam faces 201 and 202 simultaneously at the corner where they meet, and hence is fixed in position, and the rollers 302 and 304 abut against the cam faces 201 and 202, respectively, whereby the position of the movable block 300 is fixed with respect to the second orthogonal coordinates XX-YY. By extending and retracting the moving rod 402 of the rectilinear driver 400 the movable block 300 can be switched between first and second positions defined by the first and second orthogonal coordinates X-Y and XX-YY, respectively.

In the embodiment illustrated in FIG. 5 the cam faces 101 and 102 need not be perpendicular to each other and the angle between them needs only to be sufficiently larger than 0° and sufficiently smaller than 180°, whereas the cam faces 201 and 202 also need not always be perpendicular to each other and the angle between them needs only to be sufficiently larger than 0° and sufficiently smaller than 180°. Accordingly, the movable block 300 need not be square. The point is that in the first state the movable block 300 is always held at a constant first position by both the corner where the cam faces 101 and 102 meet and at least one of the cam faces 101 and 102, whereas in the second state the movable block 300 is always held at a constant second position by both the corner where the cam faces 201 and 202 meet and at least one of the cam faces 201 and 202.

Figure 6:
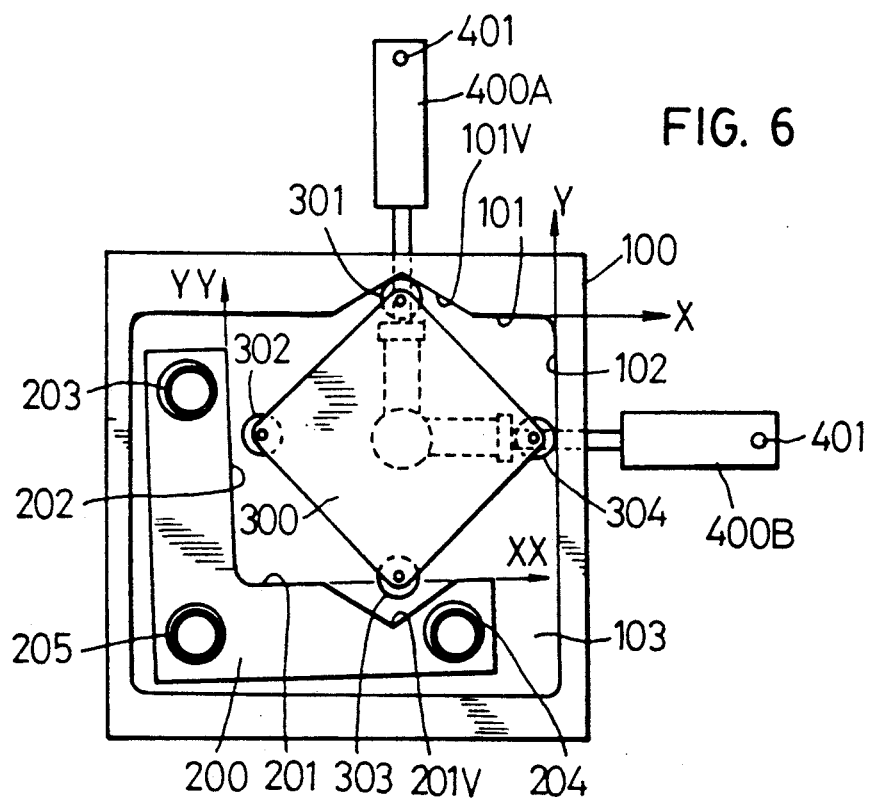
FIG. 6 is a plan view illustrating another embodiment of the positioning device.
Figure 7:
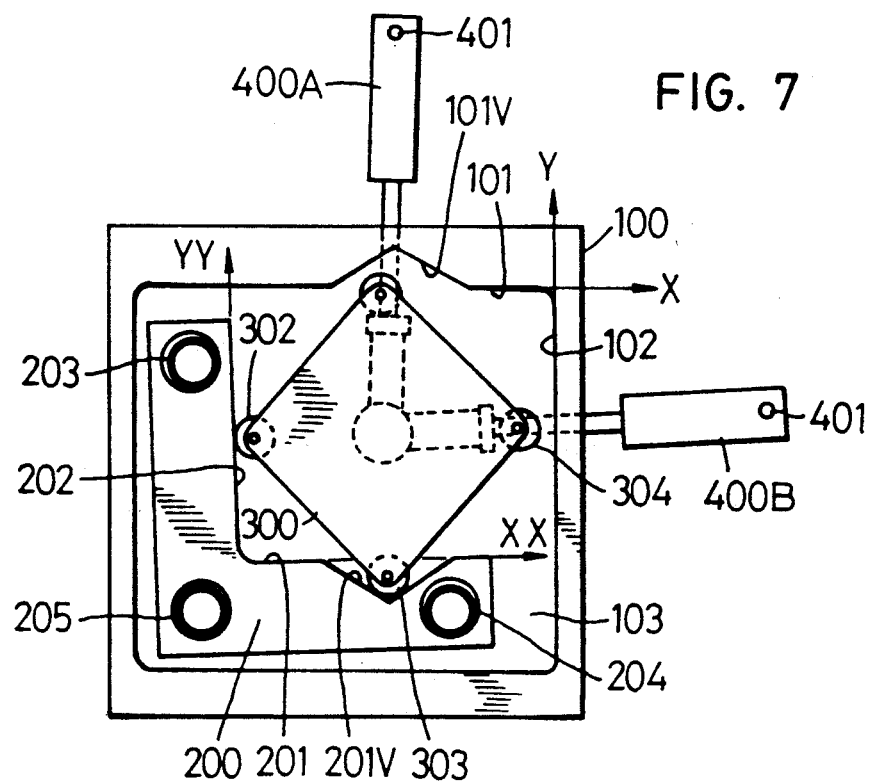
FIG. 7 is a plan view showing the state in which a movable block 300 in FIG. 6 has been switched to its second posture.

FIGS. 6 and 7 illustrate a modified form of the positioning device of the present invention. In this example, two rectilinear drivers 400A and 400B are employed to drive the movable block 300 in two directions virtually at right angles to each other, i.e. in the X-axis and Y-axis directions in this case, and the opposed faces 101 and 201 of the first and second cams 100 and 200 have V-shaped grooves 101V and 201V. The V-shaped grooves 101V and 201V correspond to the corner defined by the cam faces 101 and 102 and the corner defined by the cam faces 201 and 202 in the embodiment of FIG. 5 and each groove fixes the fulcrum of the rotatory motion of the movable block 300. Hence, as shown in FIG. 6, when the movable block 300 is in a first state in which it is pulled by both of the drivers 400A and 400B, the roller 301 is positioned by the V-shaped groove 101V and the roller 304 abuts against the cam face 102, by which the movable block 300 is fixed at a constant position with respect to the first orthogonal coordinates X-Y. Further, as shown in FIG. 7, when the movable block 300 is in a second state in which it is pushed by both of the drivers 400A and 400B, the roller 303 is positioned by the V-shaped groove 201V and the roller 302 abuts against the cam face 202, by which the movable block 300 is fixed at a constant position with respect to the second orthogonal coordinates XX-YY. In this way, the movable block 300 can be switched between the positions defined by the first and second orthogonal coordinates X-Y and XX-YY, respectively.

In the FIG. 5 embodiment it is also possible to employ two rectilinear drivers 400 as described above in respect of FIGS. 6 and 7. Conversely, in the FIG. 6 embodiment it is also possible to provide only one rectilinear driver as is the case with the FIG. 5 embodiment.

FIG. 8 illustrates an embodiment of the IC conveyor employing the positioning device of the present invention, together with the associated parts. In this embodiment the positioning device described above with regard to FIG. 5 or FIGS. 6 and 7 is utilized as a positioning device 500 which is mounted on the IC conveyor 13 which loads the surface-mounting-type IC 40 onto the test socket 23 as mentioned previously in respect of FIG. 2. That is, the positioning device 500 is mounted on the underside of the lifting gear 13B of the IC conveyor 13 which moves in the X-axis direction, and the air chuck 13A is supported by the movable block 300 forming the positioning device 500 (see FIGS. 5 through 7).

With such a structure, the air chuck 13A can be switched, by driving the movable block 300, between first and second positions defined by the first and second orthogonal coordinates X-Y and XX-YY, respectively. The IC to be tested 40 is brought by the carriage 16B of the first conveyor 16 to a predetermined position side by side with the test socket 23 in the X-axis direction. By the rectilinear driver 400 (or drivers 400A and 400B) the movable block 300 is driven to the first position defined by the first orthogonal coordinates X-Y, and in this state, the IC conveyor 13 is moved in the X-axis direction to a predetermined position where the air chuck 13A lies virtually right above the carriage 16B. Next, the positioning device 500 is lowered by the lifting gear 13B in the Z-axis direction until the air chuck 13A abuts against the top of the IC 40. The IC 40 is then held by the air chuck 13A, and hence is fixed at the first position defined by the first orthognal coordinates X-Y. In this state the positioning device 500 is lifted by the lifting gear 13B, and at a predetermined height, the IC conveyor 13 is moved in the X-axis direction to a predetermined position where the air chuck 13A lies substantially directly above the test socket 23. Then the positioning device 500 is lowered until the IC 40 held by the air chuck 13A is brought close to the test socket 23. Next, the movable block 300 is urged, by the rectilinear driver 400 (or drivers 400A and 400B), against the cam faces 201 and 202, while the position of the L-shaped second cam 200 is adjusted and fixed by the screws 203, 204 and 205 so that the IC 40 is correctly loaded onto the test socket 23.

Upon completion of predetermined tests the IC 40 held on the test socket 23 is brought by the IC conveyor 13 to the carriage 17B of the second conveyor 17. Once the position of the second cam 200 is thus adjusted, second and subsequent IC's of the same kind can be dealt with simply by repeating operations of picking up the IC 40 by the air chuck 13A from the carriage 16B of the first conveyor 16 while holding the movable block 300 at the first position and then loading the IC 40 onto the socket 23 after switching the movable block 300 to the second position.

Figure 1:
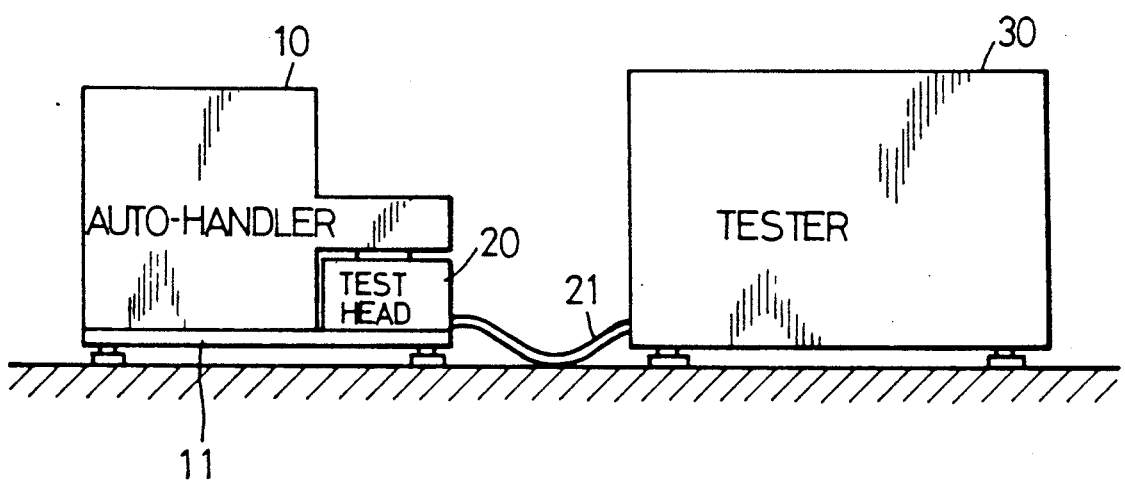
FIG. 1 is a side view of conventional surface-mounting-type IC test equipment, for explaining its outline.
Figure 3:
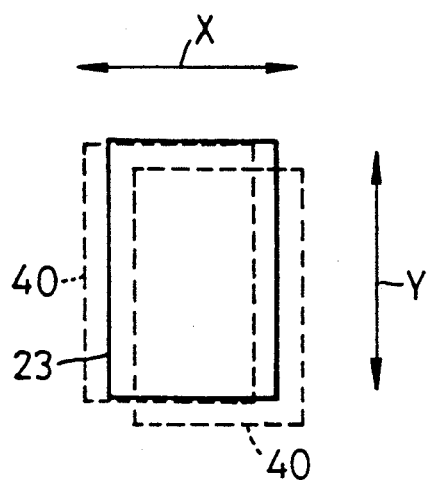
FIG. 3 is a plan view for explaining a translational position error of the IC 40.
Figure 4:
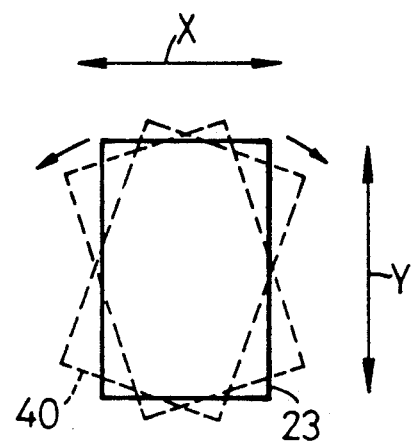
FIG. 4 is a plan view for explaining a rotational position error of the IC 40.

As described above, according to the present invention, even if the positional errors in translation and rotation, shown in FIGS. 3 and 4, are present between the positions of the IC to be tested 40 held by the air chuck 13A and the test socket 23, such positional errors can be corrected simply by adjusting the position of the second cam 200 of the positioning device 500. Hence, the IC conveyor 13 and the test socket 23 of the test head 20 can be positioned relative to each other without shifting the position of the test head 200.

It will be apparent that many modifications and variations may be effected without departing from the scope of the novel concepts of the present invention.

What is claimed is:

1. A positioning device comprising:
   a base plate;
   first cam means fixedly mounted on said base plate;
   second cam means adjustably mounted on said base plate separate and spaced from said first cam means, said second cam means being disposed on said base plate so that translational and rotational angular positions of said second cam means are adjustable within a given limit relative to said first cam means;
   fixing means for fixing said second cam means relative to said base plate in an adjusted position;

a movable block disposed between said first and second cam means;
drive means for selectively moving said block between first and second positions defined by said first and second cam means, respectively;
rollers mounted on said block; and
wherein said first and second cam means each contain wall surfaces whereby at least certain of said rollers contact said wall surfaces of said first cam means when said block is in said first position and at least certain of said rollers contact said wall surfaces of said second cam means when said block is in said second position.

2. A positioning device comprising:
a flat base plate;
first positioning means including a first wall portion having two first wall surface portions raised from said base plate and meeting each other at an angle to form a first corner, and a second wall portion having a second wall surface portion raised from said base plate at a distance from said first corner;
second positioning means separate from said first positioning means and including two third wall surface portions opposite to one of said first corner and said second wall surface portion at a distance therefrom and meeting each other at an angle to form a second corner, and a fourth wall surface portion opposite to the other of said first corner and said second wall surface portion at a distance therefrom, said second positioning means being disposed on said base plate so that its translational and rotational angular positions are adjustable within a given limit relative to said first positioning means;
fixing means whereby said second positioning means in its adjusted state is fixed relative to said base plate;
a substantially square plate-like movable block disposed between said first and second positioning means in parallel to said base plate; and
drive means for selectively moving said movable block between first and second positions defined by said first and second positioning means, respectively.

3. The positioning device of claim 2, wherein said second wall portion is formed by an extension of said first wall portion integrally therewith and said second wall surface portion is defined by a wall surface linearly extended from one of said two first wall surface portions.

4. The positioning means of claim 3, wherein said first positioning means includes two walls which have wall surfaces meeting at right angles to each other and define said first and second wall portions; said first corner is defined by said two wall surfaces meeting at right angles to each other; said second wall surface is defined by that wall surface portion of one of said two walls which is spaced apart from said first corner; said second positioning means includes an L-shaped, plate-like member having wall surfaces defining said third wall surface portions meeting at right angles to each other; said second corner is defined by said wall surfaces of said L-shaped, plate-like member; said fourth wall surface portion is defined by a portion of one of said two wall surfaces of said L-shaped, plate-like member which is spaced apart from said second corner; and said movable block is square.

5. The positioning device of claim 2, wherein said first and second walls each have wall surfaces meeting at right angles to each other; said two first wall surface portions are formed by a V-shaped groove made in the wall surface of said second wall; said second positioning means includes an L-shaped, plate-like member having two wall surfaces meeting at right angles to each other; and said two third wall surface portions are formed by a V-shaped groove made in one of said two wall surfaces of said L-shaped, plate-like member.

6. The positioning device of claim 2, wherein said movable block carries at its four corners rollers which have axes of rotation perpendicular to the top of said movable block and can be selectively brought into contact with said first, second, third and fourth wall surfaces.

7. The positioning device of claim 2, wherein said drive means includes a rod connected at one end to said movable block substantially centrally thereof so that said movable block is movable in a plane parallel to the top of said base plate, and a rectilinear driver for moving back and forth said rod lengthwise thereof.

8. The positioning device of claim 3, wherein said movable block carries at its four corners rollers which have axes of rotation perpendicular to the top of said movable block and can be selectively brought into contact with said first, second, third and fourth wall surfaces.

9. The positioning device of claim 4, wherein said movable block carries at its four corners rollers which have axes of rotation perpendicular to the top of said movable block and can be selectively brought into contact with said first, second, third and fourth wall surfaces.

10. The positioning device of claim 5, wherein said movable block carries at its four corners rollers which have axes of rotation perpendicular to the top of said movable block and can be selectively brought into contact with said first, second, third and fourth wall surfaces.

* * * * *